United States Patent
Xiong et al.

(10) Patent No.: US 12,198,462 B2
(45) Date of Patent: Jan. 14, 2025

(54) DISPLAY PANEL AND DISPLAY APPARATUS

(71) Applicants: WUHAN TIANMA MICROELECTRONICS CO., LTD., Wuhan (CN); Wuhan Tianma Microelectronics Co., Ltd. Shanghai Branch, Shanghai (CN)

(72) Inventors: Zhiyong Xiong, Wuhan (CN); Zhengxia Lv, Wuhan (CN)

(73) Assignees: WUHAN TIANMA MICROELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 17/669,280

(22) Filed: Feb. 10, 2022

(65) Prior Publication Data

US 2022/0165085 A1    May 26, 2022

(30) Foreign Application Priority Data

Oct. 28, 2021    (CN) .......................... 202111259216.6

(51) Int. Cl.
   *G06V 40/13*     (2022.01)
   *G06F 3/041*     (2006.01)
   *H10K 50/856*    (2023.01)
   *H10K 59/122*    (2023.01)
   *H10K 59/40*     (2023.01)

(52) U.S. Cl.
CPC ........ *G06V 40/1318* (2022.01); *G06F 3/0412* (2013.01); *H10K 50/856* (2023.02); *H10K 59/122* (2023.02); *H10K 59/40* (2023.02)

(58) Field of Classification Search
None
See application file for complete search history.

(56) References Cited

U.S. PATENT DOCUMENTS

| | | | |
|---|---|---|---|
| 2016/0064460 A1* | 3/2016 | Kim | H01L 27/3269 257/40 |
| 2017/0228576 A1* | 8/2017 | Kim | G06V 40/1329 |
| 2019/0171861 A1* | 6/2019 | Zhang | G06V 40/13 |
| 2019/0278968 A1* | 9/2019 | Yoshii | G06F 3/0412 |
| 2019/0325190 A1* | 10/2019 | Cui | G06V 40/13 |
| 2019/0332844 A1* | 10/2019 | Liu | H01L 27/14678 |

(Continued)

FOREIGN PATENT DOCUMENTS

| | | |
|---|---|---|
| CN | 110309775 A | 10/2019 |
| CN | 110807374 A | 2/2020 |
| CN | 113095200 A * | 7/2021 |

*Primary Examiner* — Benjamin X Casarez
(74) *Attorney, Agent, or Firm* — Christensen O'Connor Johnson Kindness PLLC

(57) ABSTRACT

A display panel and a display apparatus are provided, which can improve the fingerprint recognition sensitivity. The display panel includes: a substrate; sub-pixels located at a side of the substrate; a fingerprint sensor located at a side of the substrate away from a light-exiting side of the display panel; and a reflective portion located between the fingerprint sensor and the sub-pixels in a direction perpendicular to a plane of the substrate, and configured to increase light intensity of light that enters the fingerprint sensor.

14 Claims, 7 Drawing Sheets

(56) References Cited

U.S. PATENT DOCUMENTS

| | | | |
|---|---|---|---|
| 2020/0089927 A1* | 3/2020 | Wu | G02B 6/0055 |
| 2020/0175243 A1* | 6/2020 | Liu | G06V 40/1318 |
| 2020/0219946 A1* | 7/2020 | Ryu | H01L 27/3234 |
| 2021/0210567 A1* | 7/2021 | Cheng | G06K 19/06112 |
| 2021/0335944 A1* | 10/2021 | Guo | H01L 51/56 |
| 2022/0093704 A1* | 3/2022 | Yuan | H10K 59/65 |
| 2022/0373387 A1* | 11/2022 | Lu | G02B 5/005 |

* cited by examiner

DISPLAY PANEL AND DISPLAY APPARATUS

CROSS-REFERENCE TO RELATED APPLICATION

The present application claims priority to Chinese Patent Application No. 202111259216.6, filed on Oct. 28, 2021, the content of which is incorporated herein by reference in its entirety.

TECHNICAL FIELD

The present disclosure relates to the field of display technologies, and in particular, to a display panel and a display apparatus.

BACKGROUND

In recent years, with the continuous development of display technologies, more and more display apparatuses adopt fingerprint recognition to protect user's privacy. When operating the display apparatus with fingerprint recognition function, the user only needs to touch the display screen with his finger to achieve authorization verification. Its operation is simple.

The existing display panel with fingerprint recognition function needs to be equipped with a fingerprint sensor in the display panel when performing fingerprint recognition. Light emitted from a light source enters the fingerprint sensor after being reflected by the finger, so that the fingerprint sensor can recognize fingerprints according to differences between fingerprint valleys and fingerprint ridges in terms of reflection of the light. However, based on the structure of the existing display panel, the display panel has a poor fingerprint recognition sensitivity.

SUMMARY

In a first aspect of the present disclosure, a display panel is provided. The display panel includes: a substrate; sub-pixels located at a side of the substrate; a fingerprint sensor located at a side of the substrate away from a light-exiting side of the display panel; and a reflective portion located between the fingerprint sensor and the sub-pixels in a direction perpendicular to a plane of the substrate, and configured to increase light intensity of light that enters the fingerprint sensor.

In a second aspect of the present disclosure, a display apparatus is provided. The display apparatus includes a display panel including: a substrate; sub-pixels located at a side of the substrate; a fingerprint sensor located at a side of the substrate away from a light-exiting side of the display panel; and a reflective portion located between the fingerprint sensor and the sub-pixels in a direction perpendicular to a plane of the substrate, and configured to increase light intensity of light that enters the fingerprint sensor.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings.

DESCRIPTION OF EMBODIMENTS

In order to better understand technical solutions of the present disclosure, the embodiments of the present disclosure are described in details with reference to the drawings.

It should be clear that the described embodiments are merely part of the embodiments of the present disclosure rather than all of the embodiments. All other embodiments obtained by those skilled in the art shall fall into the protection scope of the present disclosure.

The terms used in the embodiments of the present disclosure are merely for the purpose of describing specific embodiment, rather than limiting the present disclosure. The terms "a", "an", "the" and "said" in a singular form in an embodiment of the present disclosure and the attached claims are also intended to include plural forms thereof, unless noted otherwise.

It should be understood that the term "and/or" used in the context of the present disclosure is to describe a correlation relation of related objects, indicating that there can be three relations, e.g., A and/or B can indicate only A, both A and B, and only B. In addition, the symbol "/" in the context generally indicates that the relation between the objects in front and at the back of "/" is an "or" relationship.

It should be understood that although the terms 'first', 'second' and 'third' can be used in the present disclosure to describe reflective portions, these reflective portions should not be limited to these terms. These terms are used only to distinguish the reflective portions from each other. For example, without departing from the scope of the embodiments of the present disclosure, a first reflective portion can also be referred to as a second reflective portion. Similarly, the second reflective portion can also be referred to as the first reflective portion.

Figure 1:
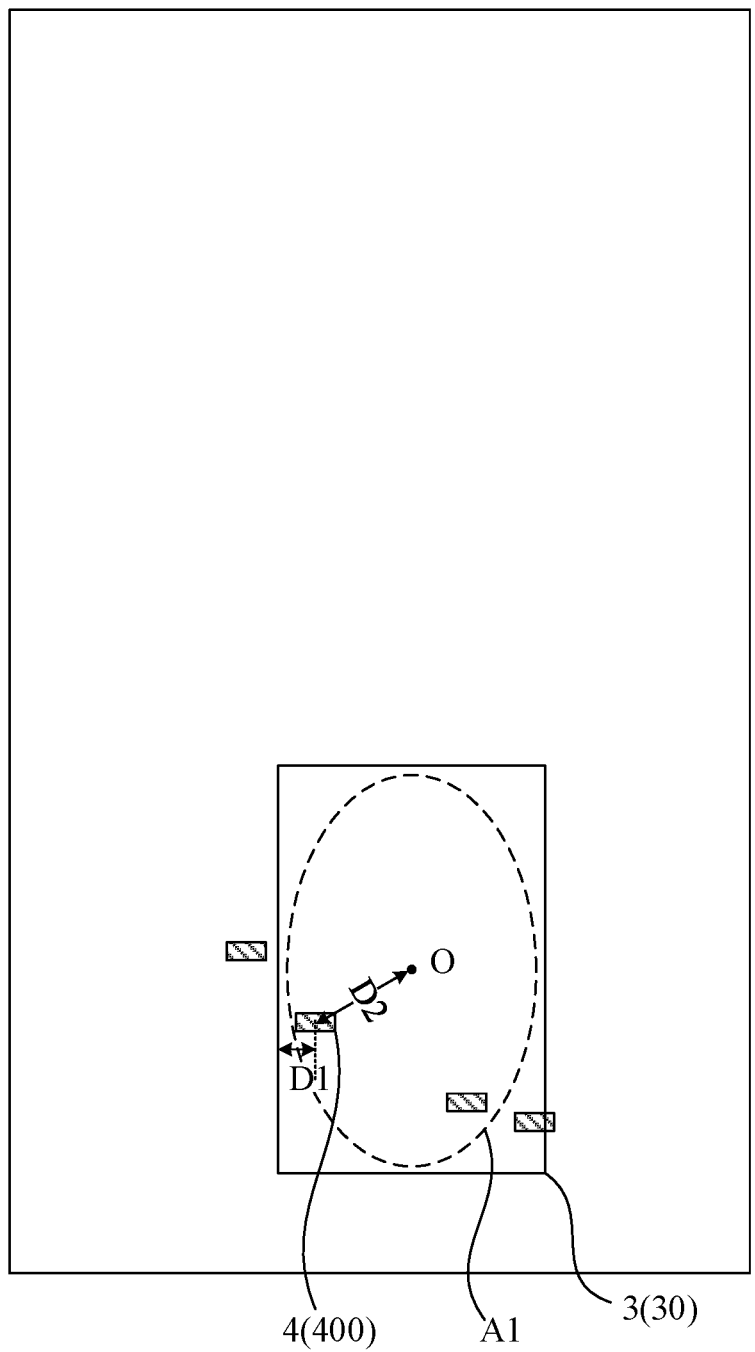
FIG. 1 is a top view of a display panel according to an embodiment of the present disclosure.
Figure 2:
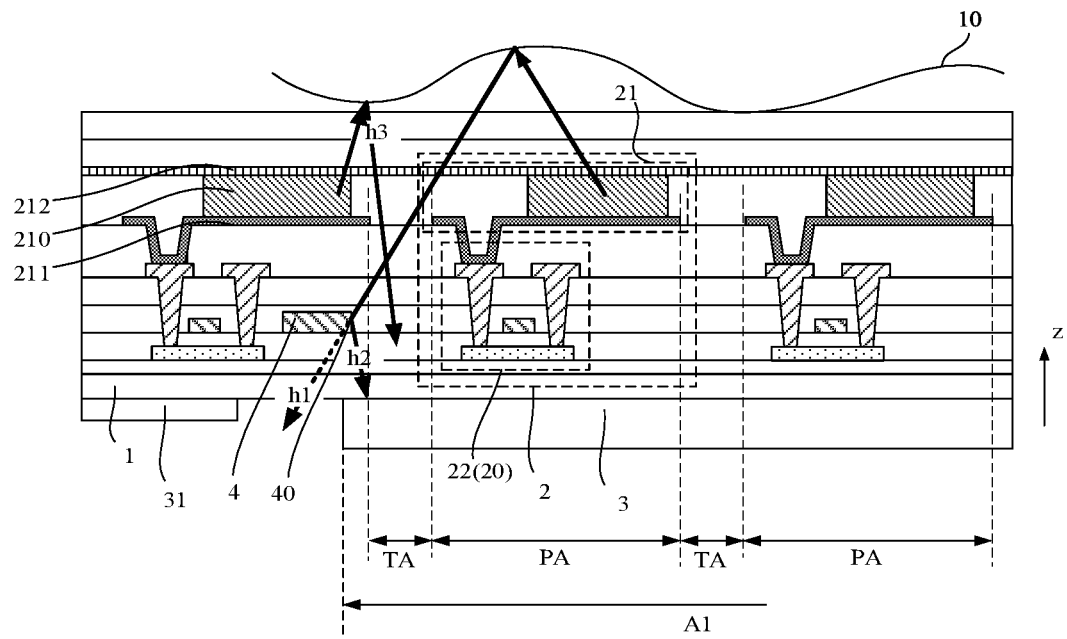
FIG. 2 is a cross-sectional view of a display panel according to an embodiment of the present disclosure.

An embodiment of the present disclosure provides a display panel. FIG. 1 is a top view of a display panel according to an embodiment of the present disclosure, and FIG. 2 is a cross-sectional view of a display panel according to an embodiment of the present disclosure. As shown in FIG. 1 and FIG. 2, the display panel includes a substrate 1, sub-pixels 2, a fingerprint sensor 3, and a reflective portion 4.

As shown in FIG. 1, the display panel has a fingerprint recognition region A1. When the user needs to unlock the display panel or perform other authorization verifications, the user can press his finger onto the fingerprint recognition region A1 of the display panel.

Exemplarily, in an embodiment of the present disclosure, the shape and area of the fingerprint sensor 3 may be consistent with the shape and area of the fingerprint recognition region A1, that is, an orthographic projection of the fingerprint sensor 3 on a plane of the display panel coincides with the fingerprint recognition region A1. In another embodiment of the present disclosure, the shape of the fingerprint sensor 3 may be inconsistent with the shape of the fingerprint recognition region A1, for example, the area of the fingerprint recognition region A1 may be slightly larger than the area of the fingerprint sensor 3, and a border of the fingerprint sensor 3 may be located within the border of the fingerprint sensing region A1; alternatively, the area of the fingerprint recognition region A1 may be slightly smaller than the area of the fingerprint sensor 3, and the border of the fingerprint sensing region A1 is located within the border of the fingerprint sensor 3. In an example, as shown in FIG. 1, the fingerprint recognition region A1 has an approximately elliptical shape, the orthographic projection of the fingerprint sensor 3 on the plane of the display panel covers the fingerprint recognition region A1.

As shown in FIG. 2, the sub-pixels 2 are located at a side of the substrate 1. The fingerprint sensor 3 is located at a side of the substrate 1 away from a light-exiting side of the display panel. An arrow direction z in FIG. 2 represents the light-emitting direction of the display panel. Along a direction perpendicular to the plane of the substrate 1, the reflective portion 4 is located between the fingerprint sensor 3 and the sub-pixel 2. Based on the orientation shown in FIG. 2, the fingerprint sensor 3 may be arranged in a partial region or an entire region under the substrate 1 to form an under-screen fingerprint system. Since fingerprint recognition can be achieved within the screen range, the display panel provided by the embodiments of the present disclosure does not need to reserve space on its light-exiting side to provide fingerprint keys, so that the display region of the display panel can be basically extended to the entire light-emitting surface of the display panel, thereby achieving a full-screen display.

In an embodiment of the present disclosure, the sub-pixel 2 can be used as a fingerprint recognition light source. When a user needs to unlock the display panel or perform other authorization verifications, as shown in FIG. 2, the user can press finger 10 onto the fingerprint recognition region A1 of the display panel. The light emitted by the sub-pixel 2 is incident to the finger 10 at the light-exiting side of the display panel, and is reflected by the surface of the finger 10 to form fingerprint reflection light. Since the reflection light generated by the fingerprint valleys and fingerprint ridges have different light intensities, the fingerprint reflection light after being reflected by the surface of the finger 10 will carry information of the fingerprint valleys and fingerprint ridges.

It should be noted that, in the embodiments of the present disclosure, the sub-pixel 2 used as the fingerprint recognition light source can be located either in the fingerprint recognition region A1 or outside the fingerprint recognition region A1, as long as the light emitted by the sub-pixel 2 is reflected by the finger 10. The two sub-pixels 2 corresponding to two light paths shown in FIG. 2 can be used as fingerprint recognition light sources.

In an embodiment of the present disclosure, the reflective portion 4 can reflect the light reflected by the finger 10, and the light reflected by the reflective portion 4 can enter the fingerprint sensor 3. That is, the reflective portion 4 can enhance the light intensity entering the fingerprint sensor 3. As shown in FIG. 2, for the part of light that propagates along a first direction h1 after being reflected by the finger 10, if the reflective portion 4 is not provided, this part of light will be incident to the region of the display panel where no fingerprint sensor 3 is provided, and cannot be utilized by the fingerprint sensor 3; and if the reflective portion 4 is provided, this part of light can be reflected by the reflective portion 4 and then propagates along a second direction h2 to be incident to the fingerprint sensor 3. The fingerprint sensor 3 can determine information of fingerprint valleys and fingerprint ridges according to the light intensity of the reflection light received by the fingerprint sensor 3, so as to achieve fingerprint recognition, thereby achieving safe use of the display panel.

It can be seen that, in the embodiments of the present disclosure, by providing the reflective portion 4 in the display panel, a part of the fingerprint reflection light is reflected again, so that the propagation direction of the light that originally cannot be utilized by the fingerprint sensor 3 can be adjusted to enter the fingerprint sensor 3, thereby enhancing the light intensity of the light that enters the fingerprint sensor 3, and thus improving the fingerprint recognition sensitivity.

Moreover, in the embodiments of the present disclosure, sub-pixels can be reused as the light source required for operation of the fingerprint sensor 3, and there is no need to additionally provide a fingerprint recognition light source in the display panel, thereby simplifying the structure of the display panel.

In addition, along a direction perpendicular to the plane of the substrate 1, in an embodiment of the present disclosure, the reflective portion 4 is located between the fingerprint sensor 3 and the sub-pixel 2, so that the reflective portion 4 does not affect normal light emission of the sub-pixel 2. When the display panel is used for fingerprint recognition, such a configuration can ensure that the light emitted from the sub-pixel 2 is not affected by the reflective portion 4 when it is incident to the finger 10. In addition, when the display panel is displayed, such a configuration can ensure that the sub-pixel 2 can emit light normally, thereby achieving a normal display effect of the display panel.

Exemplarily, as shown in FIG. 2, the display panel further includes foam 31. The foam 31 and the fingerprint sensor 3 are located at the same side of the substrate 1. The foam 31 can protect the display panel. When the display panel is subjected to an external impulsion force, the foam 31 can absorb stress, so that the stress is prevented from being transferred to the display panel.

Exemplarily, in an embodiment of the present disclosure, a through-hole may be formed in the foam 31 and the fingerprint sensor 3 may be placed in the through-hole. That is, the fingerprint sensor 3 at least partially overlaps with the foam 31 along a direction parallel to the plane of the display panel.

Exemplarily, in an embodiment of the present disclosure, one or more of the above reflective portions 4 may be provided in the display panel. FIG. 1 schematically shows that four reflective portions 4 are provided in a display panel.

As shown in FIG. 1, an orthographic projection of the fingerprint sensor 3 on the plane of the substrate 1 is defined as a first projection 30, and orthographic projections of the reflective portions 4 on the plane of the substrate 1 are defined as second projections 400. For any reflective portion 4 in the display panel, a distance D1 between the second projection 400 corresponding to the reflective portion 4 and the edge of the first projection 30 is smaller than a distance D2 between the second projection 400 corresponding to the reflective portion 4 and the center O of the first projection 30. The distance D1 between the second projection 400 and the edge of the first projection 30 refers to the shortest distance between the center of the second projection 400 and the edge of the first projection 30, and the distance D2 between the second projection 400 and the center O of the first projection 30 refers to the distance between the center of the second projection 400 and the center O of the first projection 30. In other words, in this embodiment of the present disclosure, the reflective portions 4 are all provided close to the edge of the fingerprint sensor 3.

As can be seen in combination with FIG. 2, for the fingerprint reflection light after being reflected by the finger 10, compared with the fingerprint reflection light propagating through the vicinity of the center of the fingerprint sensor 3, the fingerprint reflection light propagating through the vicinity of the edge of the fingerprint sensor 3 is more easily incident to a region where no fingerprint sensor 3 is provided in the display panel, therefore, in this embodiment of the present disclosure, the reflective portion 4 is provided close to the edge of the fingerprint sensor 3, so that most of the fingerprint reflection light reflected by the reflective portion 4 is the light propagating through the vicinity of the edge of the fingerprint sensor 3, thereby significantly increasing utilization rate of the fingerprint reflection light, and thus improving the fingerprint recognition sensitivity.

Exemplarily, as shown in FIG. 2, the sub-pixel 2 includes a light-emitting module 21 and a pixel driving circuit 22. The light-emitting module 21 and the pixel driving circuit 22 are electrically connected to each other. The light-emitting module 21 is located at a side of the pixel driving circuit 22 close to the light-exiting side of the display panel.

In an embodiment of the present disclosure, the light-emitting module 21 may include any one of an organic light-emitting diode (OLED), a quantum dot light-emitting diode (QLED), and a micro light-emitting diode (Micro-LED). As shown in FIG. 2, the light-emitting module 21 includes a first electrode 211, a second electrode 212 and a light-emitting layer 210 that are stacked. The light-emitting layer 210 is located between the first electrode 211 and the second electrode 212.

The pixel driving circuit 22 includes multiple thin film transistors 20. The number of thin film transistors 20 can be adjusted according to different design requirements, which is not limited in the present disclosure. In FIG. 2, only one thin film transistor 20 electrically connected to the light-emitting module 21 is taken as an illustration. It should be noted that the pixel driving circuit 22 may further include one or more storage capacitors, which are not shown in FIG. 2.

In an embodiment of the present disclosure, as shown in FIG. 2, the fingerprint recognition region A1 includes a pixel region PA and a transmission region TA. The pixel region PA is provided with the light-emitting module 21 or the pixel driving circuit 22 described above. The light transmittance of the transmission region TA is greater than the light transmittance of the pixel region PA.

In an embodiment of the present disclosure, when the reflective portion 4 is provided, along a direction perpendicular to the plane of the substrate 1, at least a part of the reflective portion 4 is located in the above pixel region PA, that is, the reflective portion 4 at least partially overlaps with the light-emitting module 21 or the pixel driving circuit 22. FIG. 2 shows the reflective portion 4 overlaps with the light-emitting module 21 in a direction perpendicular to the plane of the substrate 1.

The fingerprint reflection light needs to pass multiple film layers in the display panel when emitting from the finger 10 to the fingerprint sensor 3. The pixel region PA where the light-emitting module 21 and the pixel driving circuit 22 are located has a relatively low light transmittance. As shown in FIG. 2, taking the fingerprint reflection light propagating along a third direction h3 as an example, this part of fingerprint reflection light can pass through a gap between two adjacent light-emitting modules 21 and a gap between the pixel driving circuits 22 connected to the two adjacent light-emitting modules 21, and then be incident to the fingerprint sensor 3. That is, this part of fingerprint reflection light can be incident to the fingerprint sensor 3 through the transmission region TA, which has a smaller light loss during its propagation. In an embodiment of the present disclosure, the reflective portion 4 overlaps with the light-emitting module 21 or the pixel driving circuit 22, that is, at least a part of the reflective portion 4 is located in the pixel region PA. In case that the area of the reflective portion 4 is constant, the area of the reflective portion 4 located in the transmission region TA can be reduced. In this way, the fingerprint reflection light that would originally propagate through the transmission region TA can be prevented from being reflected by the reflective portion 4 as far as possible, so that this part of fingerprint reflection light can be directly incident to the fingerprint sensor 3. That is, by adopting the method provided by this embodiment of the present disclosure, the fingerprint reflection light that would originally pass through the transmission region TA to enter the fingerprint sensor 3 is not affected while achieving that the large-angle light incident to the edge of the fingerprint sensor 3 is reflected by the reflector 4 to enter the fingerprint sensor 3.

The present disclosure provides multiple implementation manners of the reflector 4, which will be described separately as follows.

As shown in FIG. 2, in an embodiment of the present disclosure, the reflective portion 4 can be provided as a single integrated structure. A non-zero angle is formed between the reflective surface 40 of the reflective portion 4 and a plane of the display panel, i.e., the reflective surface 40 is not parallel to the plane of the display panel. With such a configuration, in the case where the reflective portion 4 is provided between the fingerprint sensor 3 and the finger 10 along a direction perpendicular to the plane of the display panel, the light intensity of the fingerprint reflection light reflected by the reflective surface 40 to enter the fingerprint sensor 3 can be increased, thereby improving the fingerprint recognition sensitivity.

Figure 3:
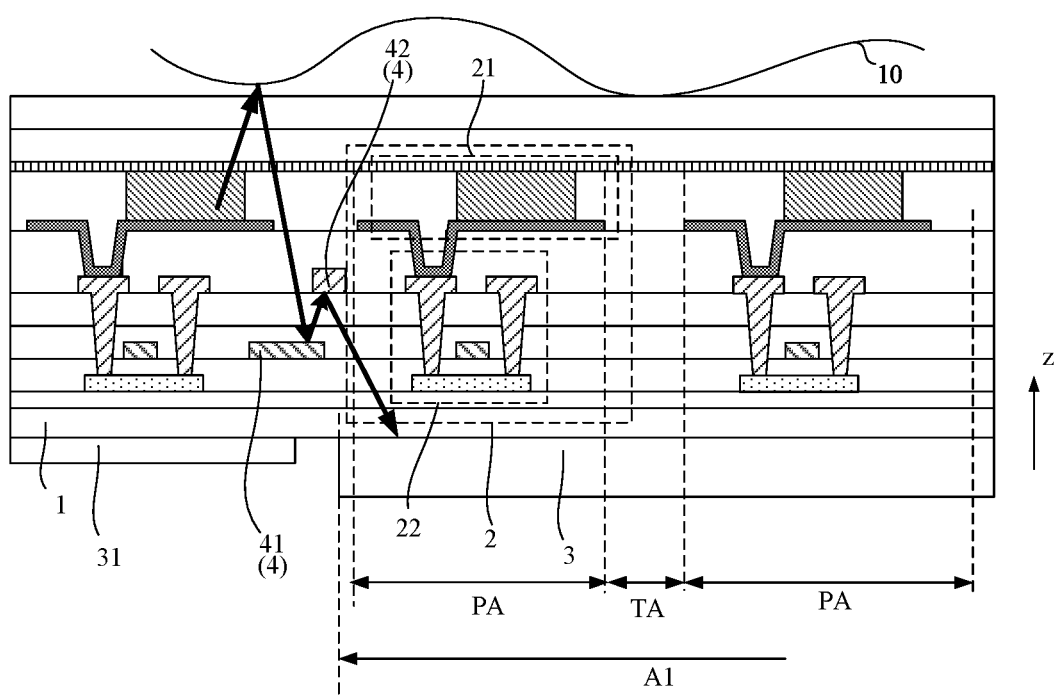
FIG. 3 is a cross-sectional view of a display panel according to another embodiment of the present disclosure.

FIG. 3 is a cross-sectional view of a display panel according to another embodiment of the present disclosure. In an embodiment of the present disclosure, as shown in FIG. 3, the reflective portion 4 may include a first reflective portion 41 and a second reflective portion 42. In addition, along a direction parallel to the plane of the substrate 1, the second reflective portion 42 is located at a side of the first reflective portion 41 close to the fingerprint sensor 3; and along a direction perpendicular to the plane of the display panel, the second reflective portion 42 is located at a side of the first reflective portion 41 close to the light-exiting side of the display panel. As shown in FIG. 3, if there is fingerprint reflection light that propagates toward the light-exiting side of the display panel after being reflected by the first reflective portion 41, for this part of fingerprint reflection light, in an embodiment of the present disclosure, the first reflective portion 41 and the second reflective portion 42 are provided according to the above positional relationship, the second reflective portion 42 can be located on the propagation path of this part of fingerprint reflection light, that is, the second reflective portion 42 can further reflect this part of fingerprint reflection light. After this part of fingerprint reflection light is reflected by the second reflective portion 42, it enters the fingerprint sensor 3, so that the light intensity of the light entering the fingerprint sensor 3 can be further increased, thereby improving the fingerprint recognition sensitivity.

Figure 4:
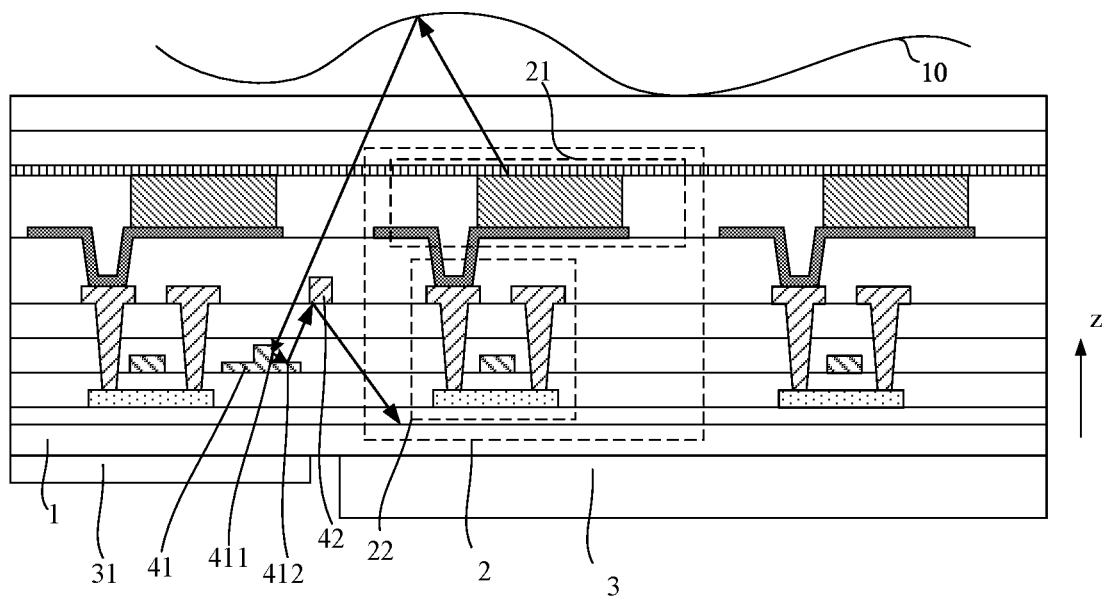
FIG. 4 is a cross-sectional view of a display panel according to another embodiment of the present disclosure.
Figure 5:
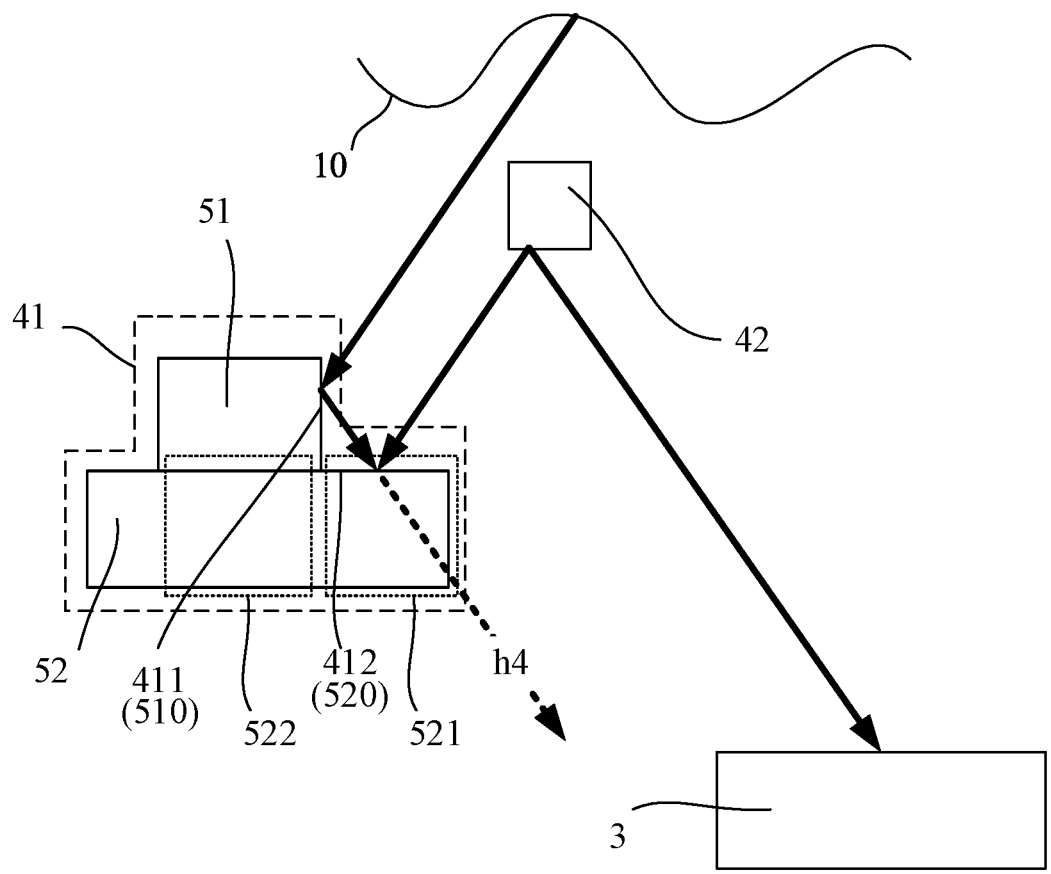
FIG. 5 is an enlarged schematic diagram showing a first reflective portion, a second reflective portion, a fingerprint sensor and a finger shown in FIG. 4.

FIG. 4 is a cross-sectional view of a display panel according to another embodiment of the present disclosure, and FIG. 5 is an enlarged schematic diagram showing a first reflective portion, a second reflective portion, a fingerprint sensor and a finger shown in FIG. 4. Exemplarily, as shown in FIGS. 4 and 5, the first reflective portion 41 includes a first reflective surface 411 and a second reflective surface 412. The first reflective surface 411 is located at a side of the second reflective surface 412 close to a light-exiting side of the display panel. Along a direction parallel to the plane of the substrate 1, the second reflective surface 412 is located at a side of the first reflective surface 411 close to the second reflective portion 42. Exemplarily, in an embodiment of the present disclosure, a non-zero angle is formed between the first reflective surface 411 and the plane of the display panel. A non-zero angle is formed between the first reflective surface 411 and the second reflective surface 412. Exemplarily, the angle formed between the first reflective surface 411 and the second reflective surface 412 is greater than or equal to 90°. As shown in FIG. 4 and FIG. 5, the first reflective surface 411 is perpendicular to the plane of the display panel, and the second reflective surface 412 is parallel to the plane of the display panel.

As shown in FIG. 5, if fingerprint reflection light is reflected by the first reflective surface 411 and then propagates along the fourth direction h4, this part of fingerprint reflection light will not be received by the fingerprint sensor 3. In this embodiment of the present disclosure, by providing the second reflective surface 412, and providing the second reflective surface 412 and the first reflective surface 411 in accordance with the above positional relationship, the light reflected by the first reflective surface 411 can be further reflected. The reflection light can be reflected by the second reflective portion 42 to enter the fingerprint sensor 3. It can be seen that such a configuration of the first reflective surface 411, the second reflective surface 412, and the second reflective portion 42 can focus the originally relatively divergent fingerprint reflection light into the fingerprint sensor 3 by means of multiple reflections, so that most of fingerprint reflection light can enter the fingerprint sensor 3, thereby further improving the fingerprint recognition sensitivity.

Exemplarily, as shown in FIG. 5, the first reflective portion 41 includes a first metal layer 51 and a second metal layer 52 that are stacked. The first metal layer 51 is located at a side of the second metal layer 52 away from the substrate (not shown in FIG. 5). The area of the first metal layer 51 is smaller than the area of the second metal layer 52. As shown in FIG. 5, the side surface 510 of the first metal layer 51 forms the first reflective surface 411 described above, and the side surface of the first metal layer 51 intersects with the plane of the substrate. The second metal layer 52 includes a first metal sub-layer 521 and a second metal sub-layer 522. The first metal sub-layer 521 does not overlap with the first metal layer 51 along a direction perpendicular to the plane of the display panel. The surface 520 of the first metal sub-layer 521 away from the substrate forms the second reflective surface 412 described above. As shown in FIG. 5, the first metal layer 51 is in contact with the second metal sub-layer 522, and the first metal layer 51 covers the second metal sub-layer 522.

Exemplarily, when manufacturing the first reflective portion 41, in the embodiments of the present disclosure, the first metal layer 51 and the second metal layer 52 may be formed in multiple steps. In an embodiment of the present disclosure, a metal layer with a relatively large thickness may be formed first, and then the surface of the metal layer may be etched to remove the materials at some positions, and the removal position corresponds to the first metal sub-layer 521 described above, so that the first reflection portion 41 having the first reflection surface 411 and the second reflection surface 412 can be formed.

Figure 6:
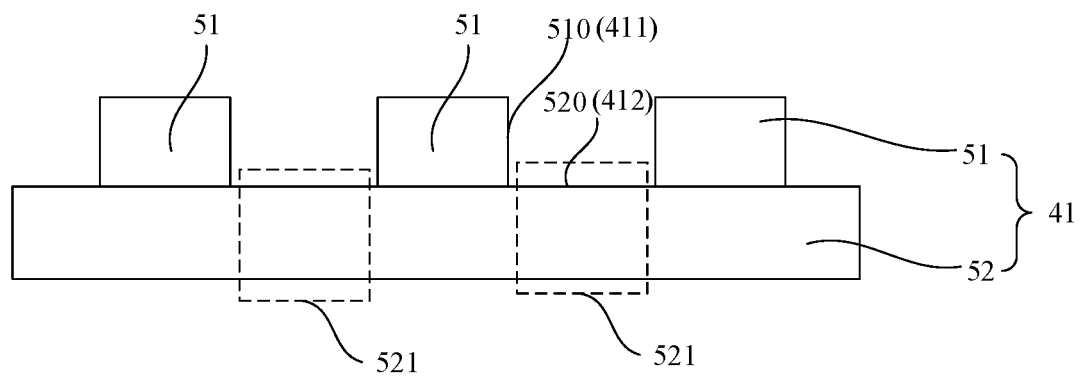
FIG. 6 is a cross-sectional view of a first reflective portion according to another embodiment of the present disclosure.

FIG. 6 is a cross-sectional view of a first reflective portion according to another embodiment of the present disclosure. Exemplarily, as shown in FIG. 6, the first reflective portion 41 includes multiple first metal layers 51. A gap is formed between two adjacent first metal layers 51. As shown in FIG. 6, the position of the gap between two adjacent first metal layers 51 corresponds to the first metal sub-layer 521 described above. The surface of the first metal sub-layer 521 located between any two adjacent first metal layers 51 can serve as the second reflective surface 412. With such a configuration, a total area of the second reflective surface 412 can be increased, so that more large-angle light incident to the edge of the fingerprint sensor 3 can be adjusted to allow more large-angle light to enter the fingerprint sensor 3, thereby improving the fingerprint recognition sensitivity.

Figure 7:
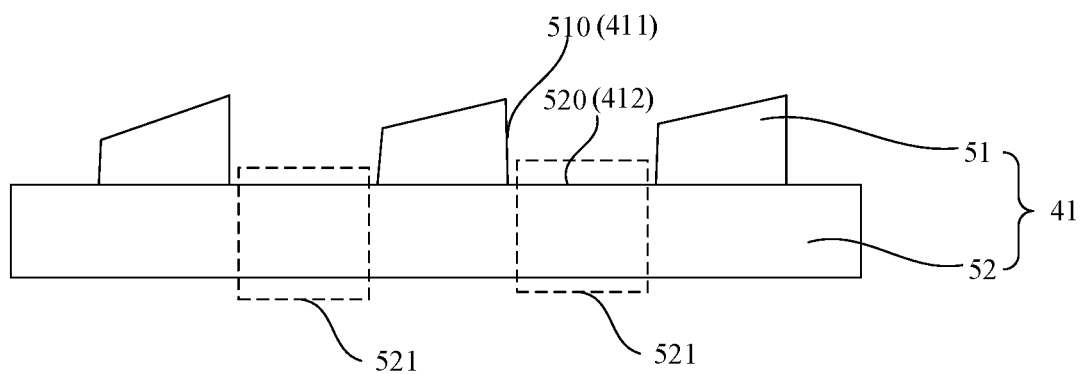
FIG. 7 is a cross-sectional view of a first reflective portion according to another embodiment of the present disclosure.
Figure 8:
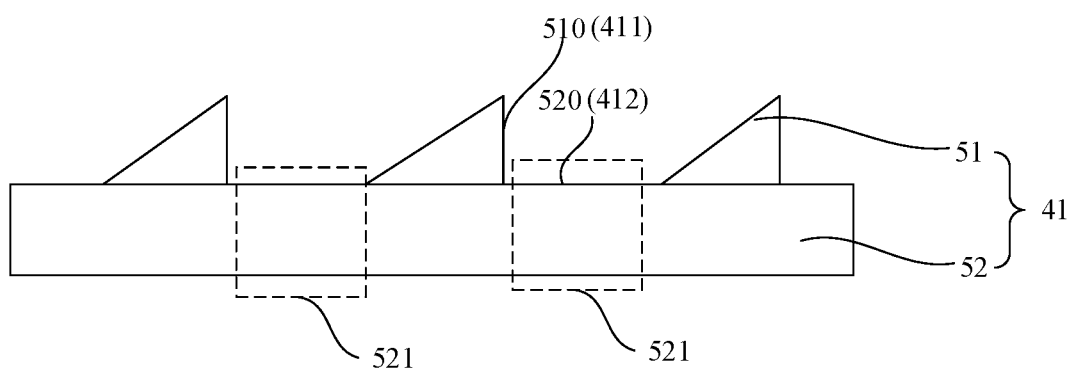
FIG. 8 is a cross-sectional view of a first reflective portion according to another embodiment of the present disclosure.

It should be noted that the cross-sectional shape of the first reflective portion 41 shown in FIG. 6 is merely for illustration, and the cross-sectional shape of the first reflective portion 41 may also be other shape in the embodiments of the present disclosure. FIG. 7 and FIG. 8 are cross-sectional views of a first reflective portion according to another two embodiments of the present disclosure. As shown in FIG. 7 and FIG. 8, the cross-sectional shape of the first metal layer 51 may be a trapezoid shape (shown in FIG. 7) or a triangle shape (shown in FIG. 8).

Figure 9:
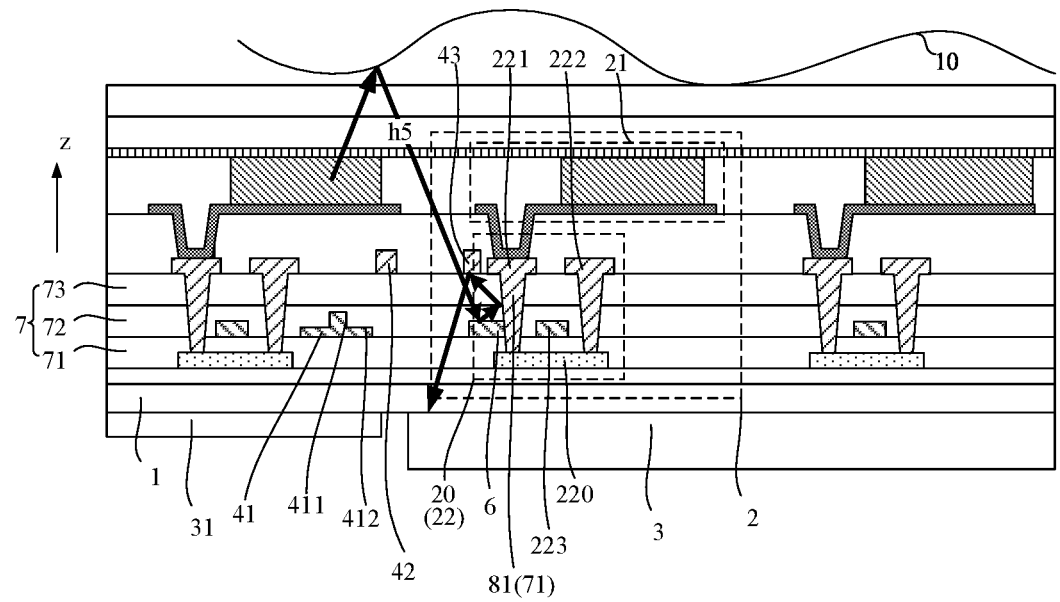
FIG. 9 is a cross-sectional view of a display panel according to another embodiment of the present disclosure.

FIG. 9 is a cross-sectional view of a display panel according to another embodiment of the present disclosure. As shown in FIG. 9, the thin film transistor 20 of the pixel driving circuit 22 includes an active layer 220. The display panel further includes a light-shielding portion 6. Along a direction perpendicular to a plane of the substrate 1, the light-shielding portion 6 is located at a side of the active layer 220 close to the light-exiting side of the display panel. The light-shielding portion 6 at least partially overlaps with the active layer 220. The light-shielding portion 6 can prevent fingerprint reflection light from being incident to the active layer 200, thereby preventing light from affecting the performance of the thin film transistor 20. In the embodiments of the present disclosure, while the reflective portion 4 is used to improve the sensitivity of the fingerprint sensor, the light shading portion 6 is provided in the display panel to ensure that the display performance of the display panel is not affected.

Exemplarily, in an embodiment of the present disclosure, the surface of the light-shielding portion 6 away from the active layer 220 is a reflective surface. That is, the fingerprint reflection light incident to the active layer 220 may be reflected.

As shown in FIG. 9, the thin film transistor 20 includes a first electrode 221, a second electrode 222 and a control electrode 223. The control electrode 223 is a gate electrode of the thin film transistor 20. One of the first electrode 221 and the second electrode 222 is a source electrode of the thin film transistor 20, and the other one of the first electrode 221 and the second electrode 222 is a drain electrode of the thin film transistor 20.

An insulation layer 7 is provided between the first electrode 221 and the active layer 220. The insulation layer 7 includes a first through-hole 70 filled with a first conductive portion 81. The first electrode 221 is electrically connected to the active layer 220 through the first conductive portion 81. A side surface of the first conductive portion 81 is a reflective surface. The side surface of the first conductive portion 81 intersects with the plane of the substrate 1.

As shown in FIG. 9, the display panel further includes a third reflective portion 43. The third reflective portion 43 is located at a side of the light-shielding portion 6 away from the substrate 1. Along a direction parallel to the plane of the substrate 1, the third reflective portion 43 and the light-shielding portion 6 are located at a same side of the first conductive portion 81. Taking the orientation shown in FIG. 9 as an example, the third reflective portion 43 and the light-shielding portion 6 are both located at the left side of the first conductive portion 81. As shown in FIG. 9, part of the fingerprint reflection light propagating along a fifth direction h5 is incident to the light-shielding portion 6, and is then reflected by the light-shielding portion 6 to be incident to the side surface of the first conductive portion 81. The first conductive portion 81 is made of metal, so that it can reflect light. Therefore, the first conductive portion 81 further reflects the light, and the reflected light is incident to the third reflective portion 43. The third reflective portion 43 can further reflect the light to the fingerprint sensor 3. It can be seen that in the embodiments of the present disclosure, the light shading portion 6 is provided to ensure that the performance of the thin film transistor 20 is not affected, and the fingerprint reflection light originally incident to the light shading portion 6 can be utilized by the fingerprint sensor 3 to avoid this part of fingerprint reflection light to be wasted, thereby further increasing the light intensity of light entering the fingerprint sensor 3, and improving the fingerprint recognition sensitivity.

It should be noted that the insulation layer 7 described above may be a single-layer structure or a multi-layer structure including multiple sub-layers that are stacked. As shown in FIG. 9, the insulation layer 7 may include a first insulation sub-layer 71, a second insulation sub-layer 72 and a third insulation sub-layer 73 which are stacked. The first insulation sub-layer 71 is located at a side of the active layer 220 away from the substrate 1. The second insulation sub-layer 72 is located at a side of the control electrode 223 away from the substrate 1. The second insulation sub-layer 72 can be used as a gate insulation layer. The third insulation sub-layer 73 is located at a side of the second insulation sub-layer 72 away from the substrate 1. The first through-hole 70 passes through the first insulation sub-layer 71, the second insulation sub-layer 72 and the third insulation sub-layer 73.

Exemplarily, the light-shielding portion 6 may be made of a metal material.

In an embodiment of the present disclosure, the second reflective portion 42 and the third reflective portion 43 may be provided in a same layer. Exemplarily, when arranging the first reflective portion 41, the second reflective portion 42 and the third reflective portion 43, the first reflective portion 41 and the gate electrode of the thin film transistor 20 may be provided in a same layer; and/or, the second reflective portion 42 and the source electrode of the thin film transistor 20 may be provided in a same layer; and/or, the third reflective portion 43 and the source electrode of the thin film transistor 20 may be provided in a same layer. The structures provided in the same layer can be formed by a same process, so that the manufacturing processes of the display panel are increased while increasing the light intensity of light that is received by the fingerprint sensor 3, thereby simplifying the manufacturing of the display panel. As shown in FIG. 3, FIG. 4, and FIG. 9, the first reflective portion 41 and the gate electrode of the thin film transistor 20 are arranged in a same layer, and the second reflective portion 42 and the source electrode of the thin film transistor 20 are arranged in a same layer.

Figure 10:
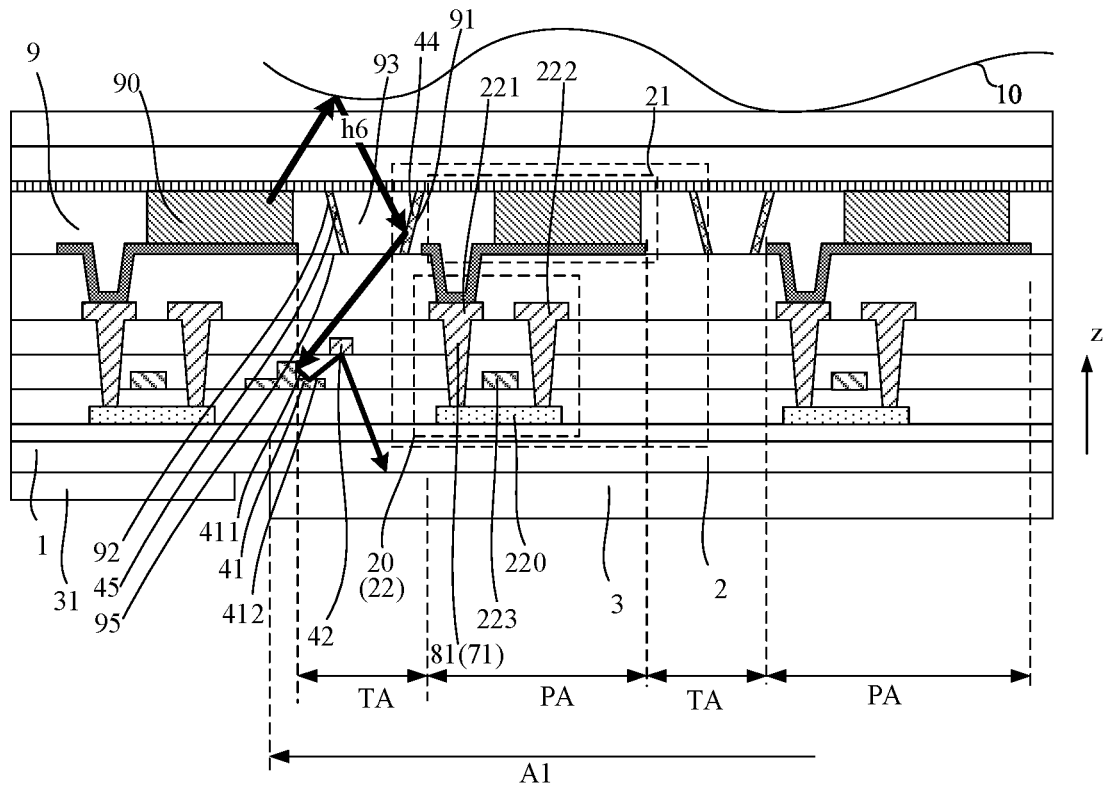
FIG. 10 is a cross-sectional view of a display panel according to another embodiment of the present disclosure.

FIG. 10 is a cross-sectional view of a display panel according to another embodiment of the present disclosure. Exemplarily, as shown in FIG. 10, the display panel further includes a pixel definition layer 9. The pixel definition layer 9 includes multiple openings 90. At least a part of the light-emitting module 21 is located in the opening 90.

In an embodiment of the present disclosure, the above transmission region TA can be arranged in multiple manners, which will be described separately as follows.

As shown in FIG. 10, the pixel definition layer 9 includes a first side surface 91 located in the transmission region TA. In an embodiment, the first side surface 91 is located between two adjacent openings 90 of the pixel definition layer 9. The first side surface 91 intersects with the plane of the display panel.

As shown in FIG. 10, the display panel further includes a fourth reflective portion 44 located at a side of the first side surface 91 close to the light-exiting side of the display panel. The fourth reflective portion 44 can reflect the fingerprint reflection light incident to the pixel region PA of the display panel located at a side of the fourth reflective portion 44.

If the fourth reflective portion 44 is not provided, as shown in FIG. 10, the fingerprint reflection light propagating along a sixth direction h6 will be incident to the pixel region PA adjacent to the fourth reflective portion 44. Since the pixel region PA has a low light transmittance, this part of fingerprint reflection light may have a greater loss during the process of propagating to the fingerprint sensor 3. In this embodiment of the present disclosure, the fourth reflective portion 44 can be provided to reflect this part of fingerprint reflection light, so that light reflected by the fourth reflective portion 44 can pass the first reflective portion 41 and the second reflective portion 42 sequentially to be incident to the fingerprint sensor 3, thereby reducing the loss of fingerprint reflection light during the process of propagating to the fingerprint sensor 3, increasing the light intensity of light that is received by the fingerprint sensor 3, and further improving the fingerprint recognition sensitivity.

Exemplarily, the fourth reflective portion 44 and the second reflective portion 42 are located at a same side of the first reflective portion 41, so that the light reflected by the fourth reflective portion 44 can be incident to the first reflective portion 41, and the light reflected by the first reflective portion 41 can be incident to the second reflective portion 42. Taking the orientation shown in FIG. 10 as an example, the fourth reflective portion 44 and the second reflective portion 42 are both located at the right side of the first reflective portion 41.

It should be noted that, similar to configuration of the reflective portion 4 that includes the first reflective portion 41 and the second reflective portion 42, in an embodiment of the present disclosure, the fourth reflective portion 44 may be provided close to the edge of the fingerprint sensor 3 to make the fourth reflective portion 44 adjust the large-angle fingerprint reflection light that would otherwise be originally incident to the pixel region PA.

As shown in FIG. 10, the pixel definition layer 9 further includes a second side surface 92. The second side surface 92 and the first side surface 91 adjacent to the second side surface 92 are located between two adjacent openings 90. The second side surface 92 intersects with the plane of the display panel.

In an embodiment of the present disclosure, as shown in FIG. 10, a light transmission layer 93 is provided between the first side surface 91 and the second side surface 92. The light transmission layer 93 has a light transmittance greater than that of the pixel definition layer 9. As shown in FIG. 10, the light transmission layer 93 may be located in the transmission region TA. Exemplarily, the light transmission layer 93 may be air or another insulation film layer having a higher light transmittance than that of the pixel definition layer 9.

As shown in FIG. 10, the display panel further includes a fifth reflective portion 45. The fifth reflective portion 45 is located at a side of the second side surface 92 close to the light-exiting side of the display panel. The fifth reflective portion 45 can reflect the fingerprint reflection light incident to the pixel region PA adjacent to the fifth reflective portion 45, so that this part of fingerprint reflection light is incident to the fingerprint sensor 23 through the transmission region TA, thereby reducing the loss of this part of light during the process of being incident to the fingerprint sensor 3, increasing the light intensity of light received by the fingerprint sensor 3, and improving the fingerprint recognition sensitivity.

Exemplarily, as shown in FIG. 10, the pixel definition layer 9 includes a bottom surface 95. The bottom surface 95 is parallel to the plane of the substrate 1, and intersects with the first side surface 91.

Exemplarily, an angle formed between the first side surface 91 and the bottom surface 95 is equal to the angle formed between the second side surface 92 and the bottom surface 95. In an embodiment of the present disclosure, when manufacturing the pixel definition layer, after the entire layer structure covering the substrate 1 is formed, two types of through-holes may be formed in the entire layer structure of the pixel definition layer by using a same patterning process. A first type of through-hole is the opening 90 described above, and the second type of through-hole corresponds to the region where the fourth reflective portion 44, the fifth reflective portion 45 and the light transmission layer 93 are formed. The above first side surface 91 and second side surface 92 can be regarded as the side wall of the second type of through-hole.

In an embodiment of the present disclosure, an angle θ formed between the bottom surface 95 of the pixel definition layer 9 and the first side surface 91 satisfies: 60°≤θ<90°.

In an embodiment of the present disclosure, θ is set to be smaller than 90°, so that the fourth reflective portion 44 formed above the first side surface 91 can better receive the fingerprint reflection light.

Figure 11:
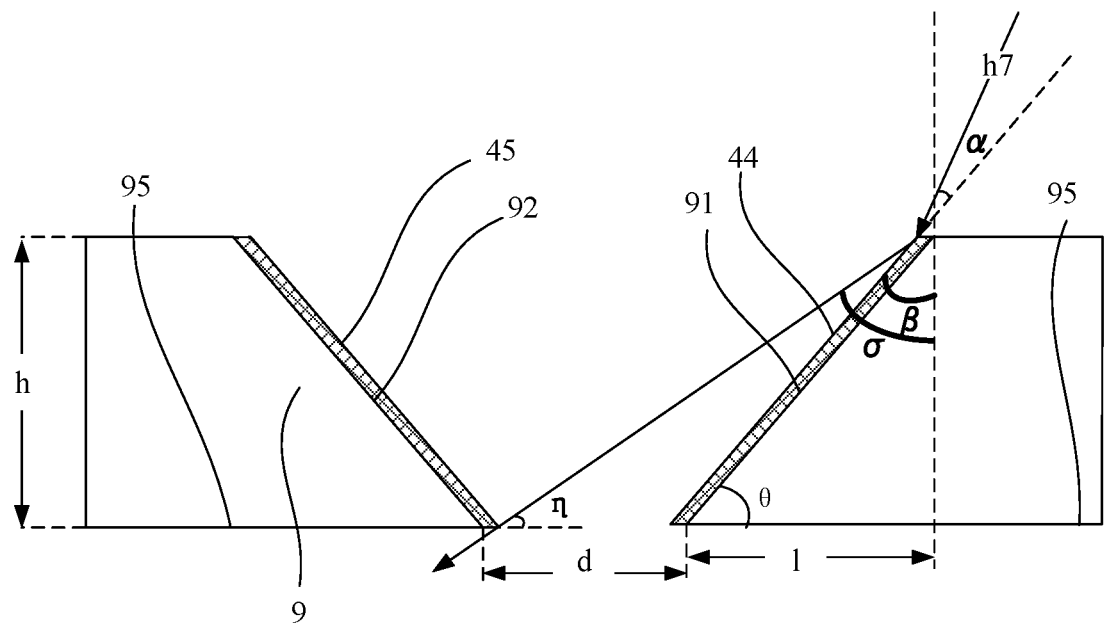
FIG. 11 is a schematic diagram showing an optical path in which fingerprint reflection light passes a fourth reflective portion.

FIG. 11 is a schematic diagram showing an optical path in which fingerprint reflection light passes a fourth reflective portion. As shown in FIG. 11, α is defined as the maximum angle formed between the effective fingerprint reflection light incident to the fourth reflective portion 44 and the plane of the fourth reflective portion 44. Here, the effective fingerprint reflection light refers to fingerprint reflection light that can be reflected by the fourth reflection portion 44 and can exit from the region between the fourth reflection portion 44 and the fifth reflection portion 45. As shown in FIG. 11, the fingerprint reflection light corresponding to a propagates along a seventh direction h7. If the propagation direction of the fingerprint reflection light incident to the fourth reflective portion 44 changes, e.g., if an angle formed between the fingerprint reflection light incident to the fourth reflective portion 44 and the plane of the fourth reflective portion 44 is greater than a, the light reflected by the fourth reflective portion 44 will be incident to the fifth reflective portion 45 and be reflected to the light-exiting side of the display panel, causing this part of fingerprint reflection light to be unable to be received by the fingerprint sensor 3 located at a backlight side of the display panel. That is, if the angle formed between the fingerprint reflection light incident to the fourth reflective portion 44 and the plane of the fourth reflective portion 44 is greater than a, this part of fingerprint reflection light will become invalid fingerprint reflection light.

Based on the structure shown in FIG. 11, according to the trigonometric function relationship: tan θ=h/l, where, h denotes a thickness of the pixel definition layer 9 at a position where no opening 90 is provided, and a thickness direction of the pixel definition layer 9 is perpendicular to the plane of the display panel 1; and 1 denotes a length of the orthographic projection of the first side surface 91 on the plane of the display panel, or a length of the orthographic projection of the second side surface 92 on the plane of the display panel.

Further, tan η=(l+d)/h, where η denotes an angle formed between the propagation direction of the fingerprint reflection light reflected by the fourth reflective portion 44 and the plane of the display panel; and d denotes the shortest distance between the first side surface 91 and the second side surface 92.

According to FIG. 11, it can be obtained that η=90°−σ=90°−(β+α), where β=90°−θ.

Then, it can be obtained that $$\alpha = \theta - \arctan\frac{l+d}{h}.$$

According to the above derivation, it can be seen that α and θ are positively correlated. Therefore, in an embodiment of the present disclosure, θ is set to be greater than or equal to 60°, and α is set to be relatively large, so that more fingerprint reflection light becomes effective fingerprint reflection light, that is, more fingerprint reflection light can be reflected by the fifth reflective portion 45, pass through the region between the fourth reflective portion 44 and the fifth reflective portion 45, and be received by the fingerprint sensor 3. With such a configuration, it is beneficial to increase the light intensity of light received by the fingerprint sensor 3. Moreover, the region between the fourth reflective portion 44 and the fifth reflective portion 45 has a relatively high light transmittance. With such a configuration, it can also achieve a small loss of the fingerprint reflection light during the process of propagating to the fingerprint sensor 3.

Figure 12:
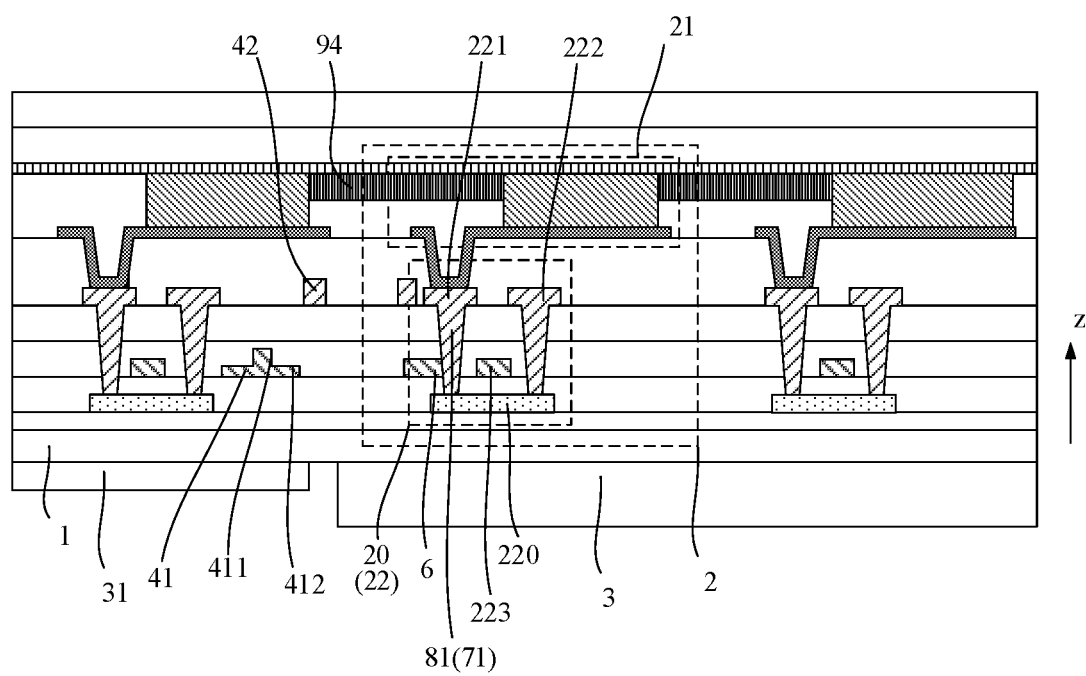
FIG. 12 is a cross-sectional view of a display panel according to another embodiment of the present disclosure.

FIG. 12 is a cross-sectional view of a display panel according to another embodiment of the present disclosure. As shown in FIG. 12, the pixel definition layer 9 further includes multiple pinholes 94 located in the transmission region TA between two adjacent light-emitting modules 21.

In an embodiment of the present disclosure, the pinhole 94 has a diameter smaller than or equal to 800 nm, so that light is diffracted when passing through the pinhole 94 located in the transmission region TA, and the diffraction light emitted from the pinhole 94 can reach the reflective portion 4 and enter the fingerprint sensor 3 after being reflected by the reflection portion 4. The display of the pixel region PA is not affected while increasing the light incident to the fingerprint sensor, thereby achieving the display effect of the display panel.

Figure 13:
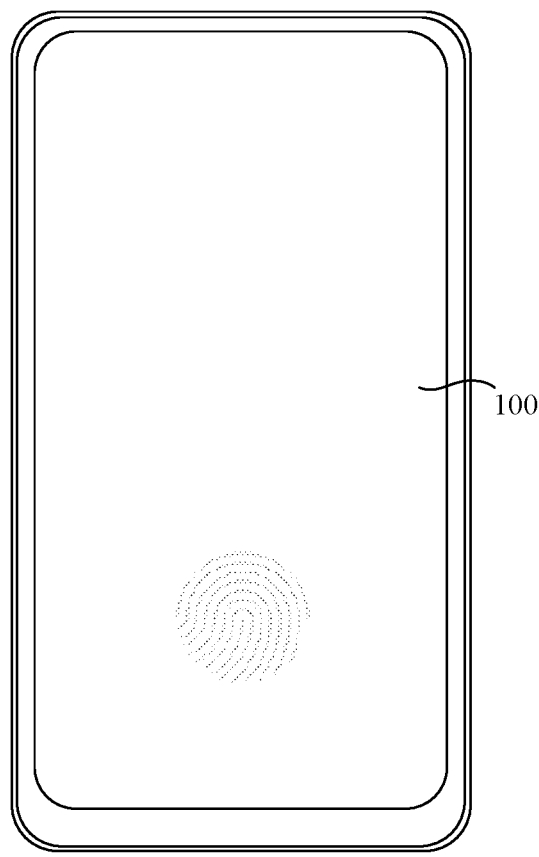
FIG. 13 is a schematic diagram showing a display apparatus according to an embodiment of the present disclosure.

The present disclosure further provides a display apparatus. FIG. 13 is a schematic diagram showing a display apparatus according to an embodiment of the present disclosure. As shown in FIG. 13, the display apparatus includes the display panel 100 described above. A specific structure of the display panel 100 has been described in detail in the above embodiments, and will not be elaborated herein. It should be noted that the display apparatus shown in FIG. 13 is merely schematic illustration, and the display apparatus may be any electronic device with a display function, such as a mobile phone, a tablet computer, a laptop computer, an electronic paper book, or a television.

In the embodiments of the present disclosure, a reflective portion is provided in the display panel, and a part of fingerprint reflection light can be further reflected, so that the propagation direction of the light that originally cannot be utilized by the fingerprint sensor can be adjusted to enter the fingerprint sensor, thereby enhancing the light intensity of light entering the fingerprint sensor, and thus improving the fingerprint recognition sensitivity.

Moreover, in the embodiments of the present disclosure, sub-pixels are reused as a light source required for operation of the fingerprint sensor, so that there is no need to additionally provide a fingerprint recognition light source in the display panel, thereby simplifying the structure of the display panel.

In addition, along the direction perpendicular to the plane of the substrate, in the embodiments of the present disclosure, the reflective portion is located between the fingerprint sensor and the sub-pixel, so that providing the reflective portion may not affect normal light emission of the sub-pixel. When the display panel is used for fingerprint recognition, with such a configuration, the light emitted from the sub-pixels is not affected by the reflective portion during the process of being incident to the finger. In addition, when the display panel is displayed, with such a configuration, the sub-pixels can emit light normally, thereby achieving the normal display effect of the display panel.

The above are merely some embodiments of the present disclosure, which, as mentioned above, are not intended to limit the present disclosure. Within the principles of the present disclosure, any modification, equivalent substitution, improvement shall fall into the protection scope of the present disclosure.

What is claimed is:

1. A display panel, comprising:
   a substrate;
   sub-pixels located at a side of the substrate;
   a fingerprint sensor located at a side of the substrate away from a light-exiting side of the display panel, wherein an orthographic projection of the fingerprint sensor on a plane of the substrate overlaps with orthographic projections of at least a first sub-pixel and a second sub-pixel on the plane of the substrate, and wherein at least a third sub-pixel is outside of the orthographic projection of the fingerprint sensor; and
   at least one reflective portion located between the fingerprint sensor and the sub-pixels in a direction perpendicular to the plane of the substrate, wherein the at least one reflective portion is configured to increase light intensity of light that enters the fingerprint sensor,
   wherein the orthographic projection of the fingerprint sensor on the plane of the substrate is defined as a first projection;
   an orthographic projection of each of the at least one reflective portion on the plane of the substrate is defined as a respective second projection, wherein individual second projections are included both within the orthographic projection of the fingerprint sensor and outside the orthographic projection of the fingerprint sensor; and
   for all reflective portions arranged in the display panel, a distance D1 between the respective second projection of each reflective portion and an edge of the first projection of the fingerprint sensor and a distance D2 between the respective second projection of the reflective portion and a center of the first projection of the fingerprint sensor satisfy D1<D2, where the distance D1 between the second projection and the edge of the first projection refers to a shortest distance between a center of the second projection and the edge of the first projection, and the distance D2 between the second projection and the center of the first projection refers to a distance between the center of the second projection and the center of the first projection.

2. The display panel according to claim 1, wherein one of the sub-pixels comprises a light-emitting module and a pixel driving circuit, the light-emitting module and the pixel driving circuit are electrically connected to each other; and the pixel driving circuit comprises a thin film transistor; and
   the at least one reflective portion at least partially overlaps with the light-emitting module along the direction perpendicular to the plane of the substrate; or the at least one reflective portion at least partially overlaps with the pixel driving circuit along the direction perpendicular to the plane of the substrate.

3. The display panel according to claim 1, wherein the at least one reflective portion comprises a first reflective portion and a second reflective portion, the second reflective portion is located at a side of the first reflective portion close to the fingerprint sensor along a direction parallel to the plane of the substrate, and the second reflective portion is located at a side of the first reflective portion close to the light-exiting side of the display panel in the direction perpendicular to a plane of the display panel.

4. The display panel according to claim 3, wherein the first reflective portion comprises a first sub-portion and a second sub-portion having different widths along the direction parallel to the plane of the substrate, the first sub-portion comprises a first reflective surface and the second sub-portion comprises a second reflective surface, wherein the first sub-portion and the second sub-portion create a non-rectangular shape; the first reflective surface is located at a side of the second reflective surface close to the light-exiting side of the display panel; and along the direction parallel to the plane of the substrate, the second reflective surface is located at a side of the first reflective surface close to the second reflective portion; and
   an angle is formed between the first reflective surface and the second reflective surface.

5. The display panel according to claim 4, wherein the first reflective portion comprises at least one first metal layer and a second metal layer that are stacked, the at least one first metal layer is located at a side of the second metal layer away from the substrate; and an area of the first metal layer is smaller than an area of the second metal layer;

the first reflective surface is formed by a side surface of the first metal layer, and the side surface of the first metal layer intersects with the plane of the substrate; and the second metal layer comprises a first metal sub-layer, the first metal sub-layer does not overlap with the first metal layer along the direction perpendicular to the plane of the display panel, and the second reflective surface is formed by a surface of the first metal sub-layer away from the substrate.

6. The display panel according to claim 5, wherein the at least one first metal layer comprises a plurality of first metal layers, and a gap is formed between two adjacent first metal layers of the plurality of first metal layers.

7. The display panel according to claim 6, further comprising a light-shielding portion, wherein a pixel driving circuit comprises a thin film transistor; and along the direction perpendicular to the plane of the substrate, the light-shielding portion is located at a side of an active layer of the thin film transistor close to the light-exiting side of the display panel, and the light-shielding portion at least partially overlaps with the active layer of the thin film transistor.

8. The display panel according to claim 7, wherein a surface of the light-shielding portion that is away from the active layer is a reflective surface;

the thin film transistor comprises a control electrode, a first electrode and a second electrode;

an insulation layer is provided between the first electrode and the active layer, the insulation layer comprises a first through-hole filled with a first conductive portion; and the first electrode is electrically connected to the active layer through the first conductive portion;

a side surface of the first conductive portion is a reflective surface; and the side surface of the first conductive portion intersects with the plane of the substrate;

the display panel further comprises a third reflective portion located at a side of the light-shielding portion away from the substrate; and the third reflective portion and the light-shielding portion are located at a same side of the first conductive portion along the direction parallel to the plane of the substrate.

9. The display panel according to claim 3, wherein each of the sub-pixels comprises a light-emitting module and a pixel driving circuit, the pixel driving circuit is electrically connected to the light-emitting module, and the pixel driving circuit comprises a thin film transistor; and the first reflective portion and a gate electrode of the thin film transistor are arranged in a same layer; and, the second reflective portion and a source electrode of the thin film transistor are arranged in a same layer.

10. The display panel according to claim 3, wherein each of the sub-pixels comprises a light-emitting module and a pixel driving circuit, the pixel driving circuit is electrically connected to the light-emitting module, and the pixel driving circuit comprises a thin film transistor; and the first reflective portion and a gate electrode of the thin film transistor are arranged in a same layer; or, the second reflective portion and a source electrode of the thin film transistor are arranged in a same layer.

11. The display panel according to claim 1, further comprising a pixel definition layer and a fourth reflection portion, wherein each of the sub-pixels comprises a light-emitting module;

the pixel definition layer comprises a plurality of openings, and at least a part of the light-emitting module is located in one of the plurality of openings; and the pixel definition layer further comprises a first side surface located between two adjacent openings of the plurality of openings, and the fourth reflection portion is located at a side of the first side surface close to the light-exiting side of the display panel.

12. The display panel according to claim 11, wherein the pixel definition layer further comprises a bottom surface parallel to the plane of the substrate, the bottom surface intersects with the first side surface, and an angle $\theta$ formed between the bottom surface and the first side surface satisfies $60° \leq \theta < 90°$.

13. The display panel according to claim 1, further comprising a pixel definition layer, wherein each of the sub-pixels comprises a light-emitting module;

the pixel definition layer comprises a plurality of openings, and at least a part of the light-emitting module is located in one of the plurality of openings; and the pixel definition layer further comprises a plurality of pinholes located between two adjacent light-emitting modules of the light-emitting modules of the sub-pixels, and each of the plurality of pinholes has a diameter smaller than or equal to 800 nm.

14. A display apparatus, comprising a display panel, wherein the display panel comprises:

a substrate;

sub-pixels located at a side of the substrate;

a fingerprint sensor located at a side of the substrate away from a light-exiting side of the display panel, wherein an orthographic projection of the fingerprint sensor on a plane of the substrate overlaps with orthographic projections of at least a first sub-pixel and a second sub-pixel on the plane of the substrate, and wherein at least a third sub-pixel is outside of the orthographic projection of the fingerprint sensor; and at least one reflective portion located between the fingerprint sensor and the sub-pixels in a direction perpendicular to the plane of the substrate, wherein the at least one reflective portion is configured to increase light intensity of light that enters the fingerprint sensor, wherein the orthographic projection of the fingerprint sensor on the plane of the substrate is defined as a first projection;

an orthographic projection of each of the at least one reflective portion on the plane of the substrate is defined as a respective second projection, wherein individual second projections are included both within the orthographic projection of the fingerprint sensor and outside the orthographic projection of the fingerprint sensor; and for all reflective portions arranged in the display panel, a distance D1 between the respective second projection of each reflective portion and an edge of the first projection of the fingerprint sensor and a distance D2 between the respective second projection of the reflective portion and a center of the first projection of the fingerprint sensor satisfy D1<D2, where the distance D1 between the second projection and the edge of the first projection refers to a shortest distance between a center of the second projection and the edge of the first projection, and the distance D2 between the second projection and the center of the first projection refers to a distance between the center of the second projection and the center of the first projection.

\* \* \* \* \*